United States Patent
Ha et al.

(10) Patent No.: US 7,659,609 B2
(45) Date of Patent: Feb. 9, 2010

(54) INTEGRATED CIRCUIT PACKAGE-IN-PACKAGE SYSTEM WITH CARRIER INTERPOSER

(75) Inventors: Jong-Woo Ha, Seoul (KR); BumJoon Hong, Seoul (KR); Sang-Ho Lee, Kyounggi (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 233 days.

(21) Appl. No.: 11/849,127

(22) Filed: Aug. 31, 2007

(65) Prior Publication Data
US 2009/0057862 A1 Mar. 5, 2009

(51) Int. Cl.
*H01L 21/56* (2006.01)
(52) U.S. Cl. ............... 257/686; 257/723; 257/E23.169; 438/108; 438/109
(58) Field of Classification Search ............... 257/777, 257/723, 778, 678, E23.08, E21.505, E23.169; 438/107, 108, 109, 110
See application file for complete search history.

(56) References Cited

U.S. PATENT DOCUMENTS

| | | | |
|---|---|---|---|
| 6,313,998 B1 | 11/2001 | Kledzik et al. | |
| 6,861,288 B2 * | 3/2005 | Shim et al. | 438/109 |
| 6,972,481 B2 | 12/2005 | Karnezos | |
| 7,053,476 B2 | 5/2006 | Karnezos | |
| 7,064,426 B2 | 6/2006 | Karnezos | |
| 7,205,647 B2 | 4/2007 | Karnezos | |
| 7,291,926 B2 * | 11/2007 | Tao et al. | 257/777 |
| 7,354,800 B2 * | 4/2008 | Carson | 438/109 |
| 2004/0061213 A1 | 4/2004 | Karnezos | |

* cited by examiner

*Primary Examiner*—Roy K Potter
(74) *Attorney, Agent, or Firm*—Mikio Ishimaru

(57) ABSTRACT

An integrated circuit package-in-package system includes: mounting an integrated circuit device over a package carrier; forming a subassembly including: providing an integrated circuit package system having a carrier interposer with an integrated circuit die thereover, and mounting a device under the carrier interposer; mounting the subassembly over the integrated circuit device; and encapsulating the subassembly and the integrated circuit device over the package carrier.

18 Claims, 4 Drawing Sheets

INTEGRATED CIRCUIT PACKAGE-IN-PACKAGE SYSTEM WITH CARRIER INTERPOSER

TECHNICAL FIELD

The present invention relates generally to an integrated circuit package system and more particularly to an integrated circuit package-in-package system.

BACKGROUND ART

In order to interface an integrated circuit with other circuitry, it is common to mount it on a lead frame or substrate. Each integrated circuit has bonding pads that are individually connected to the substrate's contact or terminal pads using extremely fine gold or aluminum wires or conductive balls, such as solder balls. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". Particularly acute, the needs for portable personal electronics, such as cell phones, digital cameras, music players, personal digital assistants (PDA's), and location-based devices, have further driven the need for increased integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a printed circuit board (PCB) substrate onto which a set of separate integrated circuit components are directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, multi-chip packages provide integration solutions for packing more integrated circuits and components into a single package. However, market driven requirements continue to drive conventional multi-chip packages to smaller and smaller form factors.

Thus, a need still remains for an integrated circuit package-in-package system providing smaller form factor, low cost manufacturing, improved yield, improved reliability, and greater flexibility to offer more functionality and fewer footprints on the printed circuit board. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including: mounting an integrated circuit device over a package carrier; forming a subassembly including: providing an integrated circuit package system having a carrier interposer with an integrated circuit die thereover, and mounting a device under the carrier interposer; mounting the subassembly over the integrated circuit device; and encapsulating the subassembly and the integrated circuit device over the package carrier.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
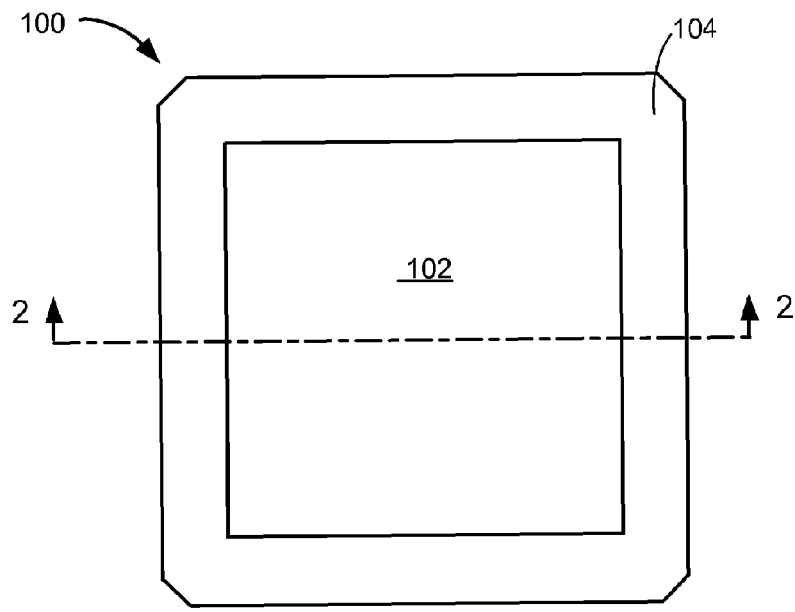
FIG. 1 is a top view of an integrated circuit package-in-package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package-in-package system 100 in a first embodiment of the present invention. The top view depicts the integrated circuit package-in-package system 100 having a first inner encapsulation 102, such as an epoxy molding compound, and a package encapsulation 104, such as an epoxy molding compound. The first inner encapsulation 102 is preferably surrounded by the package encapsulation 104. For illustrative purposes, the integrated circuit package-in-package system 100 is shown with the first inner encapsulation 102 exposed by the package encapsulation 104, although it is understood that the first inner encapsulation 102 may not be exposed.

Figure 2:
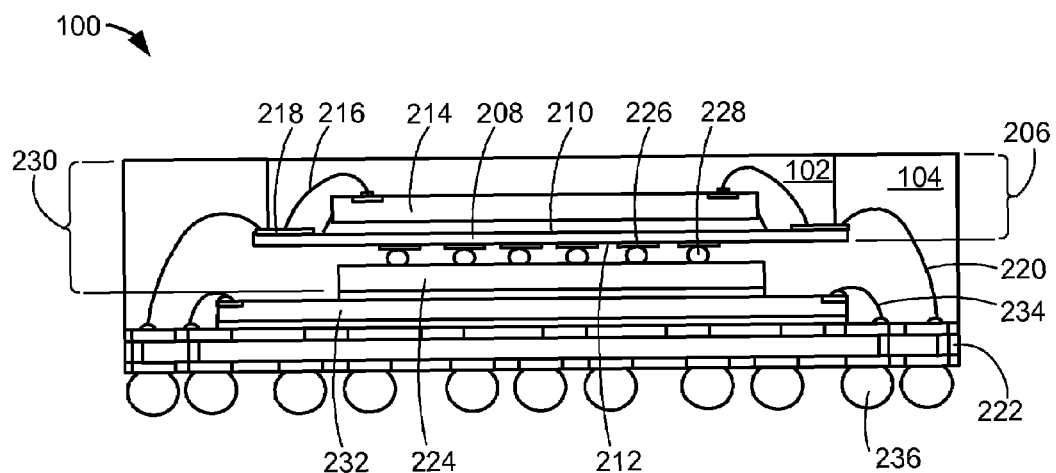
FIG. 2 is a cross-sectional view of the integrated circuit package-in-package system along line 2-2 of FIG. 1.

Referring now to FIG. 2, therein is shown a cross-sectional view of the integrated circuit package-in-package system 100 along line 2-2 of FIG. 1. The cross-sectional view depicts an integrated circuit package system 206 having a carrier interposer 208. The carrier interposer 208 may serve a number of functions. For example, the carrier interposer 208 may function as the carrier for the integrated circuit package system 206. Another example, the carrier interposer 208 may function as an interposer for the integrated circuit package-in-package system 100.

The carrier interposer 208 includes a first side 210 and a second side 212 with the first side 210 preferably having a first integrated circuit die 214 mounted thereover. Inner interconnects 216, such as bond wires or ribbon bond wires, preferably connect the first integrated circuit die 214 and contact lands 218 at the first side 210.

The first inner encapsulation 102 covers the first integrated circuit die 214 and the inner interconnects 216 over the first side 210 of the carrier interposer 208. The first inner encapsulation 102 preferably partially exposes the contact lands 218 and the first side 210. First internal interconnects 220, such as bond wires or ribbon bond wires, connect a package carrier 222, such as substrate, and the integrated circuit package system 206. The first internal interconnects 220 connect with the integrated circuit package system 206 at the exposed portion of the contact lands 218 from the first inner encapsulation 102. A device 224, such as an integrated circuit or a structure having a redistribution layer, may connect to contact pads 226 at the second side 212 with electrical connectors 228, such as solder balls or solder bumps.

For illustrative purposes, the carrier interposer 208 is shown have having conductive regions, such as the contact lands 218 and the contact pads 226, at the first side 210 and the second side 212, although it is understood that the carrier interposer 208 may have other portions that are electrically conductive. For example, the carrier interposer 208 may include multiple layers (not shown) of routing traces (not shown) not exposed at the first side 210 and the second side 212. In addition, the carrier interposer 208 may also include electrical vias (not shown) for connecting the layers of routing traces.

The device 224 is preferably assembled with the integrated circuit package system 206 forming a subassembly 230 before assembly into the integrated circuit package-in-package system 100. The integrated circuit package system 206 may be tested individually without the device 224 attached to the carrier interposer 208 ensuring known-good-device (KGD). The device 224 may also be tested individually before assembly with the carrier interposer 208 ensuring KGD. Moreover, the subassembly 230 may also be tested before assembly into the integrated circuit package-in-package system 100. The individual and subassembly testing ensure KGD improving the yield of the integrated circuit package-in-package system 100.

The subassembly 230 is preferably attached to a second integrated circuit device 232, such as an integrated circuit die, wherein the second integrated circuit device 232 preferably mounts over the package carrier 222. The device 224 mounts over the second integrated circuit device 232. Second internal interconnects 234, such as bond wires or ribbon bond wires, connect the second integrated circuit device 232 and the package carrier 222. External interconnects 236, such as solder balls, preferably attach to the bottom of the package carrier 222.

The package encapsulation 104 covers the first internal interconnects 220, the second integrated circuit device 232, and the second internal interconnects 234 over the package carrier 222. The package encapsulation 104 partially covers the subassembly exposing a top surface of the first inner encapsulation 102.

It has been discovered that the present invention provides an integrated circuit package-in-package system having improved component integration while also reducing the form factor of the resultant package. The carrier interposer serving both as a carrier for a packaged integrated circuit and an interposer for mounting other devices increase the component density. The pre-assembly of devices with the packaged integrated circuit having the carrier interposer further increases component density as well as minimizes the space required for all the components in the integrated circuit package-in-package system by eliminating the need for a separate spacer structure. For example, if 70% of the top surface of the second integrated circuit device 232 may be used for attaching components, for example the device 224, 25-30% increase in component density is expected.

Figure 3:
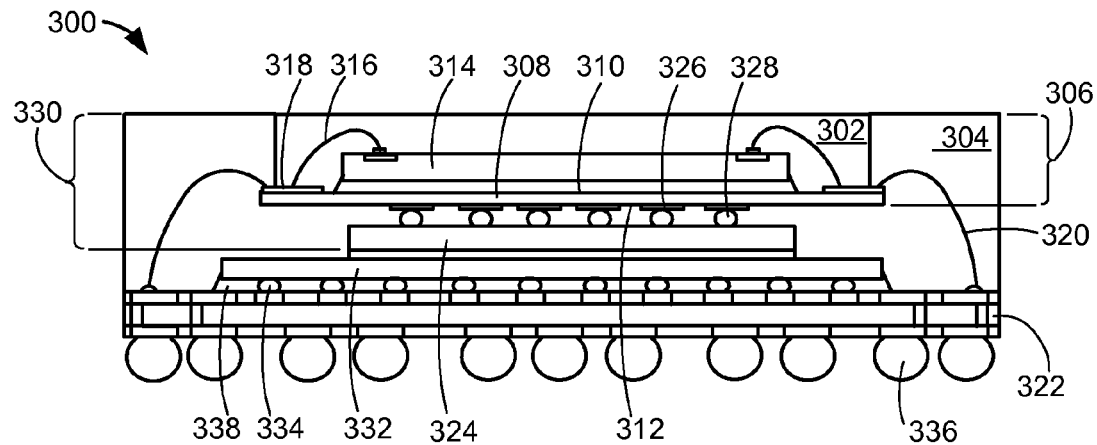
FIG. 3 is a cross-sectional view of an integrated circuit package-in-package system exemplified by the top view of FIG. 1 in a second embodiment of the present invention.

Referring now to FIG. 3, therein is shown a cross-sectional view of an integrated circuit package-in-package system 300 exemplified by the top view of FIG. 1 in a second embodiment of the present invention. The cross-sectional view depicts an integrated circuit package system 306 having a carrier interposer 308. The carrier interposer 308 may serve a number of functions. For example, the carrier interposer 308 may function as the carrier for the integrated circuit package system 306. Another example, the carrier interposer 308 may function as an interposer for the integrated circuit package-in-package system 300.

The carrier interposer 308 includes a first side 310 and a second side 312 with the first side 310 preferably having a first integrated circuit die 314 mounted thereover. Inner interconnects 316, such as bond wires or ribbon bond wires, preferably connect the first integrated circuit die 314 and contact lands 318 at the first side 310.

A first inner encapsulation 302, such as an epoxy molding compound, covers the first integrated circuit die 314 and the inner interconnects 316 over the first side 310 of the carrier interposer 308. The first inner encapsulation 302 preferably partially exposes the contact lands 318 and the first side 310. First internal interconnects 320, such as bond wires or ribbon bond wires, connect a package carrier 322, such as substrate, and the integrated circuit package system 306. The first internal interconnects 320 connect with the integrated circuit package system 306 at the exposed portion of the contact lands 318 from the first inner encapsulation 302. A device 324, such as an integrated circuit or a structure having a redistribution layer, may connect to contact pads 326 at the second side 312 with electrical connectors 328, such as solder balls or solder bumps.

For illustrative purposes, the carrier interposer 308 is shown have having conductive regions, such as the contact lands 318 and the contact pads 326, at the first side 310 and the second side 312, although it is understood that the carrier interposer 308 may have other portions that are electrically conductive. For example, the carrier interposer 308 may include multiple layers (not shown) of routing traces (not shown) not exposed at the first side 310 and the second side 312. In addition, the carrier interposer 308 may also include electrical vias (not shown) for connecting the layers of routing traces.

The device 324 is preferably assembled with the integrated circuit package system 306 forming a subassembly 330 before assembly into the integrated circuit package-in-package system 300. The integrated circuit package system 306 may be tested individually without the device 324 attached to the carrier interposer 308 ensuring known-good-device (KGD). The device 324 may also be tested individually before assembly with the carrier interposer 308 ensuring KGD. Moreover, the subassembly 330 may also be tested before assembly into the integrated circuit package-in-package system 300. The individual and subassembly testing ensure KGD improving the yield of the integrated circuit package-in-package system 300.

The subassembly 330 is preferably attached to a second integrated circuit device 332, such as a flip chip, wherein the second integrated circuit device 332 preferably mounts over the package carrier 322. The device 324 mounts over the second integrated circuit device 332. Second internal interconnects 334, such as solder bumps, connect the second integrated circuit device 332 and the package carrier 322. An underfill 338 may be applied under the second integrated circuit device 332 surrounding the second internal interconnects 334. External interconnects 336, such as solder balls, preferably attach to the bottom of the package carrier 322.

A package encapsulation 304, such as an epoxy molding compound, covers the first internal interconnects 320, the second integrated circuit device 332, and the second internal interconnects 334 over the package carrier 322. The package encapsulation 304 partially covers the subassembly exposing a top surface of the first inner encapsulation 302.

Figure 4:
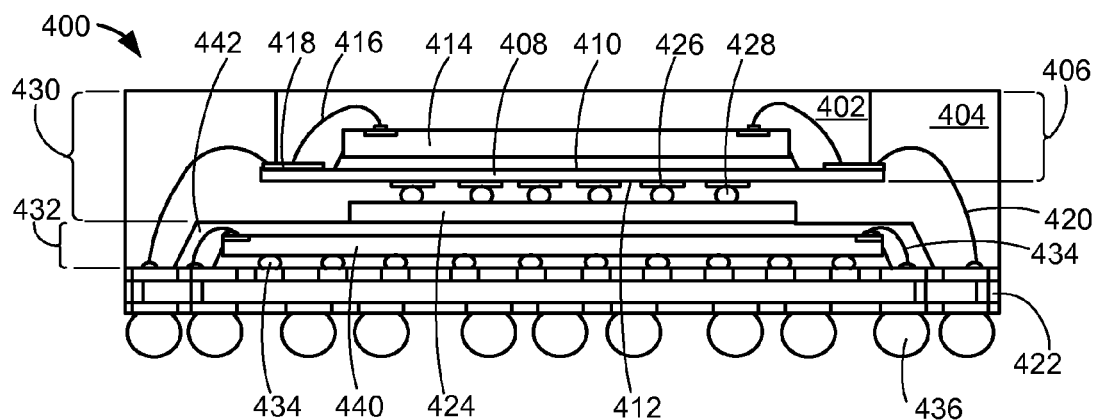
FIG. 4 is a cross-sectional view of an integrated circuit package-in-package system exemplified by the top view of FIG. 1 in a third embodiment of the present invention.

Referring now to FIG. 4, therein is shown a cross-sectional view of an integrated circuit package-in-package system 400 exemplified by the top view of FIG. 1 in a third embodiment of the present invention. The cross-sectional view depicts an integrated circuit package system 406 having a carrier interposer 408. The carrier interposer 408 may serve a number of functions. For example, the carrier interposer 408 may function as the carrier for the integrated circuit package system 406. Another example, the carrier interposer 408 may function as an interposer for the integrated circuit package-in-package system 400.

The carrier interposer 408 includes a first side 410 and a second side 412 with the first side 410 preferably having a first integrated circuit die 414 mounted thereover. Inner interconnects 416, such as bond wires or ribbon bond wires, preferably connect the first integrated circuit die 414 and contact lands 418 at the first side 410.

A first inner encapsulation 402, such as an epoxy molding compound, covers the first integrated circuit die 414 and the inner interconnects 416 over the first side 410 of the carrier interposer 408. The first inner encapsulation 402 preferably partially exposes the contact lands 418 and the first side 410. First internal interconnects 420, such as bond wires or ribbon bond wires, connect a package carrier 422, such as substrate, and the integrated circuit package system 406. The first internal interconnects 420 connect with the integrated circuit package system 406 at the exposed portion of the contact lands 418 from the first inner encapsulation 402. A device 424, such as an integrated circuit or a structure having a redistribution layer, may connect to contact pads 426 at the second side 412 with electrical connectors 428, such as solder balls or solder bumps.

For illustrative purposes, the carrier interposer 408 is shown have having conductive regions, such as the contact lands 418 and the contact pads 426, at the first side 410 and the second side 412, although it is understood that the carrier interposer 408 may have other portions that are electrically conductive. For example, the carrier interposer 408 may include multiple layers (not shown) of routing traces (not shown) not exposed at the first side 410 and the second side 412. In addition, the carrier interposer 408 may also include electrical vias (not shown) for connecting the layers of routing traces.

The device 424 is preferably assembled with the integrated circuit package system 406 forming a subassembly 430 before assembly into the integrated circuit package-in-package system 400. The integrated circuit package system 406 may be tested individually without the device 424 attached to the carrier interposer 408 ensuring known-good-device (KGD). The device 424 may also be tested individually before assembly with the carrier interposer 408 ensuring KGD. Moreover, the subassembly 430 may also be tested before assembly into the integrated circuit package-in-package system 400. The individual and subassembly testing ensure KGD improving the yield of the integrated circuit package-in-package system 400.

The subassembly 430 is preferably attached to a second integrated circuit device 432, wherein the second integrated circuit device 432 preferably mounts over the package carrier 422. Second internal interconnects 434, such as solder bumps, connect a third integrated circuit die 440 of the second integrated circuit device 432 and the package carrier 422. A second inner encapsulation 442, such as an epoxy molding compound, covers the third integrated circuit die 440 and the second internal interconnects 434 over the package carrier 422 forming the second integrated circuit device 432. The device 424 mounts over the second integrated circuit device 432. External interconnects 436, such as solder balls, preferably attach to the bottom of the package carrier 422.

A package encapsulation 404, such as an epoxy molding compound, covers the first internal interconnects 420 and the second integrated circuit device 432 over the package carrier 422. The package encapsulation 404 partially covers the subassembly 430 exposing a top surface of the first inner encapsulation 402.

Figure 5:
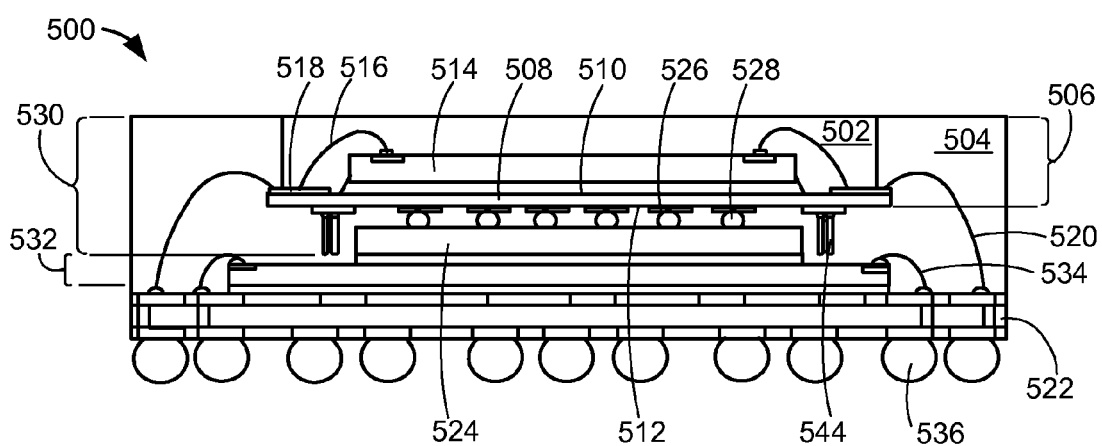
FIG. 5 is a cross-sectional view of an integrated circuit package-in-package system exemplified by the top view of FIG. 1 in a fourth embodiment of the present invention.

Referring now to FIG. 5, therein is shown a cross-sectional view of an integrated circuit package-in-package system 500 exemplified by the top view of FIG. 1 in a fourth embodiment of the present invention. The cross-sectional view depicts an integrated circuit package system 506 having a carrier interposer 508. The carrier interposer 508 may serve a number of functions. For example, the carrier interposer 508 may function as the carrier for the integrated circuit package system 506. Another example, the carrier interposer 508 may function as an interposer for the integrated circuit package-in-package system 500.

The carrier interposer 508 includes a first side 510 and a second side 512 with the first side 510 preferably having a first integrated circuit die 514 mounted thereover. Inner interconnects 516, such as bond wires or ribbon bond wires, preferably connect the first integrated circuit die 514 and contact lands 518 at the first side 510.

A first inner encapsulation 502, such as an epoxy molding compound, covers the first integrated circuit die 514 and the inner interconnects 516 over the first side 510 of the carrier interposer 508. The first inner encapsulation 502 preferably partially exposes the contact lands 518 and the first side 510. First internal interconnects 520, such as bond wires or ribbon bond wires, connect a package carrier 522, such as substrate, and the integrated circuit package system 506. The first internal interconnects 520 connect with the integrated circuit package system 506 at the exposed portion of the contact lands 518 from the first inner encapsulation 502.

First devices 544, such as passive components, may be attached to a predetermined selection of contact pads 526 exposed at the second side 512 of the carrier interposer 508. A second device 524, such as an integrated circuit or a structure having a redistribution layer, may connect to the contact pads 526 at the second side 512 with electrical connectors 528, such as solder balls or solder bumps.

For illustrative purposes, the carrier interposer 508 is shown have having conductive regions, such as the contact lands 518 and the contact pads 526, at the first side 510 and the second side 512, although it is understood that the carrier interposer 508 may have other portions that are electrically conductive. For example, the carrier interposer 508 may include multiple layers (not shown) of routing traces (not shown) not exposed at the first side 510 and the second side 512. In addition, the carrier interposer 508 may also include electrical vias (not shown) for connecting the layers of routing traces.

The first devices 544 and the second device 524 are preferably assembled with the integrated circuit package system 506 forming a subassembly 530 before assembly into the integrated circuit package-in-package system 500. The integrated circuit package system 506 may be tested individually without other devices attached to the carrier interposer 508 ensuring known-good-device (KGD). The first devices 544 and the second device 524 may also be tested individually before assembly with the carrier interposer 508 ensuring KGD. Moreover, the subassembly 530 may also be tested before assembly into the integrated circuit package-in-package system 500. The individual and subassembly testing ensure KGD improving the yield of the integrated circuit package-in-package system 500.

The subassembly 530 is preferably attached to a second integrated circuit device 532, wherein the second integrated circuit device 532 preferably mounts over the package carrier 522. The second device 524 preferably mounts over the second integrated circuit device 532. Second internal interconnects 534, such as bond wires or ribbon bond wires, connect the second integrated circuit device 532 and the package carrier 522. External interconnects 536, such as solder balls, preferably attach to the bottom of the package carrier 522.

A package encapsulation 504 covers the first internal interconnects 520, the second integrated circuit device 532, and the second internal interconnects 534 over the package carrier 522. The package encapsulation 504 partially covers the subassembly exposing a top surface of the first inner encapsulation 502.

It has been discovered that the present invention provides an integrated circuit package-in-package system having improved component integration while also reducing the form factor of the resultant package. The carrier interposer serving both as a carrier for a packaged integrated circuit and an interposer for mounting other devices increase the component density. The pre-assembly of devices, such as both passive and active devices, with the packaged integrated circuit having the carrier interposer further increase component density as well as minimized the space required for all the components in the integrated circuit package-in-package system.

Figure 6:
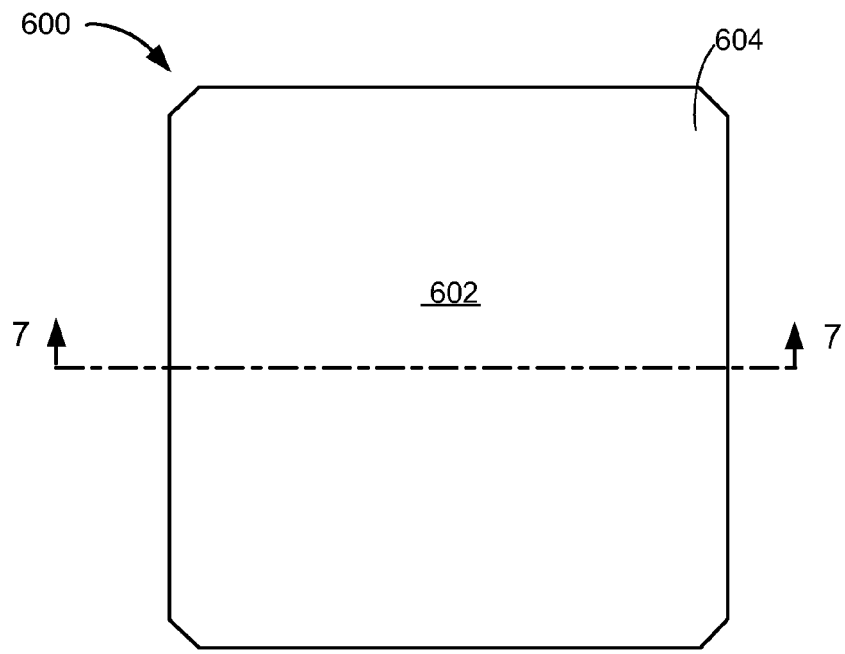
FIG. 6 is a top view of an integrated circuit package-in-package system in a fifth embodiment of the present invention.

Referring now to FIG. 6, therein is shown a top view of an integrated circuit package-in-package system 600 in a fifth embodiment of the present invention. The top view depicts the integrated circuit package-in-package system 600 having a package encapsulation 604, such as an epoxy molding compound. For illustrative purposes, the integrated circuit package-in-package system 600 is shown with the package encapsulation 604, although it is understood that the integrated circuit package-in-package system 600 may expose other encapsulations (not shown).

Figure 7:
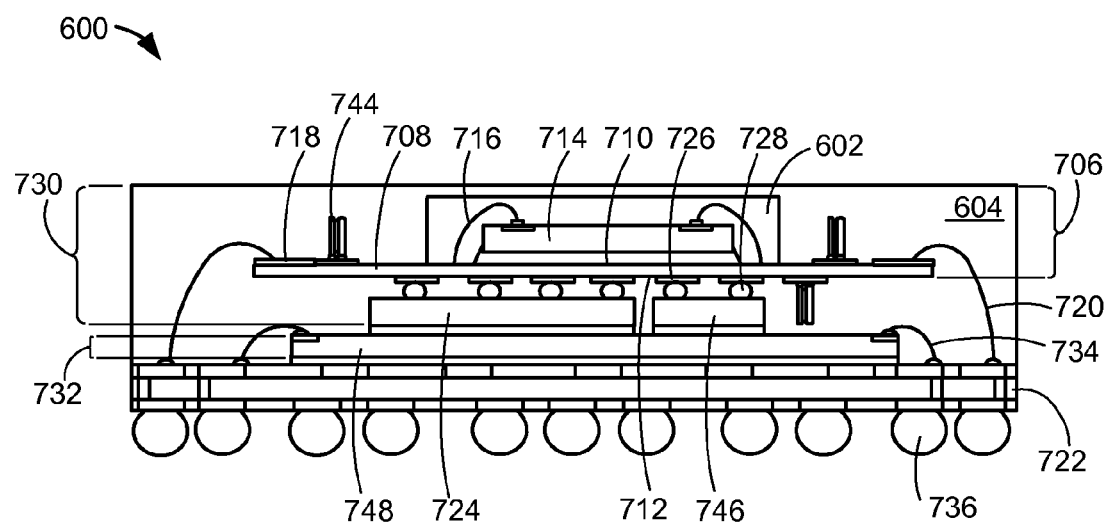
FIG. 7 is a cross-sectional view of the integrated circuit package-in-package system along line 7-7 of FIG. 6.

Referring now to FIG. 7, therein is shown a cross-sectional view of the integrated circuit package-in-package system 600 along line 7-7 of FIG. 6. The cross-sectional view depicts an integrated circuit package system 706 having a carrier interposer 708. The carrier interposer 708 may serve a number of functions. For example, the carrier interposer 708 may function as the carrier for the integrated circuit package system 706. Another example, the carrier interposer 708 may function as an interposer for the integrated circuit package-in-package system 600.

The carrier interposer 708 includes a first side 710 and a second side 712 with the first side 710 preferably having a first integrated circuit die 714 mounted thereover. Inner interconnects 716, such as bond wires or ribbon bond wires, preferably connect the first integrated circuit die 714 and the carrier interposer 708 at the first side 710.

A first inner encapsulation 602 covers the first integrated circuit die 714 and the inner interconnects 716 over the first side 710 of the carrier interposer 708. The first inner encapsulation 602 preferably exposes contact lands 718 at the first side 710. First internal interconnects 720, such as bond wires or ribbon bond wires, connect a package carrier 722, such as substrate, and the integrated circuit package system 706. The first internal interconnects 720 connect with the integrated circuit package system 706 at the contact lands 718.

First devices 744, such as passive components, may be attached to a predetermined selection of contact pads 726 exposed at the first side 710 and the second side 712. A second device 724, such as an integrated circuit or a structure having a redistribution layer, may connect to a predetermined selection of the contact pads 726 at the second side 712 with electrical connectors 728, such as solder balls or solder bumps. A third device 746, such as an integrated circuit or a structure having a redistribution layer, may connect to a different predetermined selection of the contact pads 726 at the second side 712 with the electrical connectors 728, such as solder balls or solder bumps.

For illustrative purposes, the carrier interposer 708 is shown have having conductive regions, such as the contact lands 718 and the contact pads 726, at the first side 710 and the second side 712, although it is understood that the carrier interposer 708 may have other portions that are electrically conductive. For example, the carrier interposer 708 may include multiple layers (not shown) of routing traces (not shown) not exposed at the first side 710 and the second side 712. In addition, the carrier interposer 708 may also include electrical vias (not shown) for connecting the layers of routing traces.

The first devices 744, the second device 724, and the third device 746 are preferably assembled with the integrated circuit package system 706 forming a subassembly 730 before assembly into the integrated circuit package-in-package system 600. The integrated circuit package system 706 may be tested individually without other devices attached to the carrier interposer 708 ensuring known-good-device (KGD). The first devices 744, the second device 724, and the third device 746 may also be tested individually before assembly with the carrier interposer 708 ensuring KGD. Moreover, the subassembly 730 may also be tested before assembly into the integrated circuit package-in-package system 600. The individual and subassembly testing ensure KGD improving the yield of the integrated circuit package-in-package system 600.

The subassembly 730 is preferably attached to a second integrated circuit device 732, such as an integrated circuit die, wherein the second integrated circuit device 732 preferably mounts over the package carrier 722. The second device 724 and the third device 746 preferably mounts over a second integrated circuit die 748. Second internal interconnects 734, such as bond wires or ribbon bond wires, connect the second integrated circuit device 732 and the package carrier 722. External interconnects 736, such as solder balls, preferably attach to the bottom of the package carrier 722.

The package encapsulation 604 covers the first internal interconnects 720, the second integrated circuit device 732, and the second internal interconnects 734 over the package carrier 722. The package encapsulation 604 partially covers the subassembly exposing a top surface of the first inner encapsulation 602.

Figure 8:
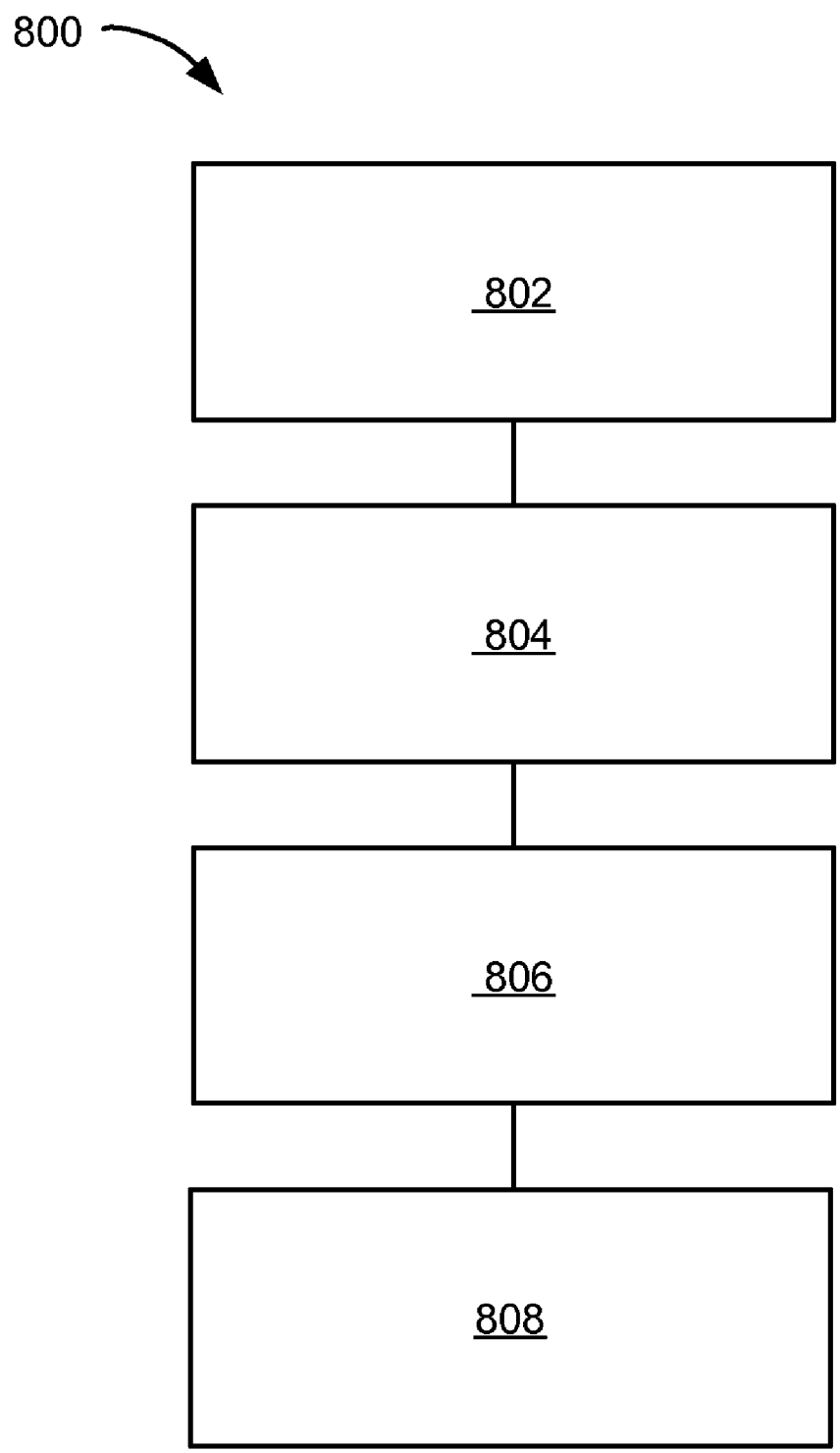
FIG. 8 is a flow chart of an integrated circuit package-in-package system for manufacturing of the integrated circuit package-in-package system in an embodiment of the present invention.

Referring now to FIG. 8, therein is shown a flow chart of an integrated circuit package-in-package system 800 for manufacturing the integrated circuit package-in-package system 100 in an embodiment of the present invention. The system 800 includes mounting an integrated circuit device over a package carrier in a block 802; forming a subassembly including: providing an integrated circuit package system having a carrier interposer with an integrated circuit die thereover, and mounting a device under the carrier interposer in a block 804; mounting the subassembly over the integrated circuit device in a block 806; and encapsulating the subassembly and the integrated circuit device over the package carrier in a block 808.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-in-package system of the present invention furnishes important and heretofore unknown and unavailable solutions, capabilities, and functional aspects for improving yield, increasing reliability, and reducing cost of circuit system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method for manufacturing an integrated circuit package-in-package system comprising:
    mounting an integrated circuit device over a package carrier;
    forming a subassembly including:
        providing an integrated circuit package system having a carrier interposer with an integrated circuit die thereover, and
        mounting a device under the carrier interposer,
        forming an inner encapsulation over the integrated circuit die and the carrier interposer;
    mounting the subassembly over the integrated circuit device; and
    encapsulating the subassembly and the integrated circuit device over the package carrier, with the inner encapsulation exposed.

2. The method as claimed in claim 1 further comprising mounting a further device over the carrier interposer.

3. The method as claimed in claim 1 further comprising mounting a further device under the carrier interposer and adjacent to the device.

4. The method as claimed in claim 1 wherein mounting the subassembly over the integrated circuit device includes mounting the device over the integrated circuit device.

5. A method of manufacturing an integrated circuit package-in-package system comprising:
    mounting an integrated circuit device over a package carrier;
    forming a subassembly including:
        providing an integrated circuit package system having a carrier interposer with an integrated circuit die thereover, and
        connecting a device under the carrier interposer with an electrical connector;
    mounting the subassembly over the integrated circuit device with the device over the integrated circuit device; and encapsulating the subassembly and the integrated circuit device over the package carrier.

6. The method as claimed in claim 5 wherein mounting the subassembly over the integrated circuit device includes mounting the device over an inner encapsulation of the integrated circuit device.

7. The method as claimed in claim 5 wherein mounting the subassembly over the integrated circuit device includes mounting the device over a flip chip.

8. The method as claimed in claim 5 further comprising forming the subassembly includes mounting a passive device to the carrier Interposer.

9. The method as claimed in claim 5 further comprising attaching an external interconnect under the package carrier.

10. An integrated circuit package-in-package system comprising:
 a package carrier;
 an integrated circuit device over the package carrier;
 a subassembly over the integrated circuit device with the subassembly including:
  an integrated circuit package system having a carrier interposer with an integrated circuit die thereover, and
  a device under the carrier interposer, and
  an inner encapsulation over the integrated circuit die and the carrier interposer; and
 a package encapsulation as a cover for the subassembly and the integrated circuit device over the package carrier, with the inner encapsulation exposed by the package encapsulation.

11. The system as claimed in claim 10 further comprising a further device over the carrier interposer.

12. The system as claimed in of claim 10 further comprising a further device under the carrier interposer and adjacent to the device.

13. The system as claimed in claim 10 wherein the subassembly over the integrated circuit device includes the device over the integrated circuit device.

14. The system as claimed in claim 10 wherein:
 the inner encapsulation is a first inner encapsulation over the integrated circuit die and the carrier interposer; and
 the device includes an electrical connector attached to the carrier interposer and mounted over the integrated circuit device.

15. The system as claimed in claim 14 wherein the subassembly over the integrated circuit device includes the device over a second inner encapsulation of the integrated circuit device.

16. The system as claimed in of claim 14 wherein the subassembly over the integrated circuit device includes the device over a flip chip.

17. The system as claimed in claim 14 further comprising the subassembly includes a passive device connected to the earner interposer.

18. The system as claimed in claim 14 further comprising an external interconnect under the package carrier.

* * * * *

UNITED STATES PATENT AND TRADEMARK OFFICE
CERTIFICATE OF CORRECTION

PATENT NO. : 7,659,609 B2  Page 1 of 1
APPLICATION NO. : 11/849127
DATED : February 9, 2010
INVENTOR(S) : Ha et al.

It is certified that error appears in the above-identified patent and that said Letters Patent is hereby corrected as shown below:

1. Column 2, line 39, delete "line 2-2" and insert therefor --line 2–2--
2. Column 2, line 53, delete "line 7-7" and insert therefor --line 7–7--
3. Column 3, line 10, delete "figures." and insert therefor --FIGs.--
4. Column 3, line 51, delete "line 2-2" and insert therefor --line 2–2--
5. Column 8, line 47, delete "line 7-7" and insert therefor --line 7–7--
6. Column 11, claim 8, line 12, delete "Interposer" and insert therefor --interposer--
7. Column 12, claim 17, line 25, delete "earner" and insert therefor --carrier--

Signed and Sealed this

Eighteenth Day of May, 2010

David J. Kappos
*Director of the United States Patent and Trademark Office*